(12) United States Patent
Saran et al.

(10) Patent No.: US 6,625,882 B1
(45) Date of Patent: *Sep. 30, 2003

(54) SYSTEM AND METHOD FOR REINFORCING A BOND PAD

(75) Inventors: Mukul Saran, Richardson, TX (US); Charles A. Martin, McKinney, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 570 days.

(21) Appl. No.: 09/248,303

(22) Filed: Feb. 11, 1999

Related U.S. Application Data

(62) Division of application No. 08/847,239, filed on Apr. 30, 1997, now Pat. No. 6,143,396.

(51) Int. Cl.[7] .................................................. H01R 9/00
(52) U.S. Cl. .............................. 29/843; 29/846; 29/840; 228/180.21; 228/180.22
(58) Field of Search .................... 29/843, 845, 846, 29/840; 264/619; 156/89.12; 228/180.21, 180.22

(56) References Cited

U.S. PATENT DOCUMENTS

| | | | | | |
|---|---|---|---|---|---|
| 3,918,148 A | * | 11/1975 | Magdo et al. | ................ | 29/576 |
| 4,357,203 A | * | 11/1982 | Zelez | .......................... | 156/643 |
| 4,882,454 A | * | 11/1989 | Peterson et al. | ........... | 174/68.5 |
| 4,963,697 A | * | 10/1990 | Peterson et al. | ............. | 174/252 |
| 5,061,567 A | * | 10/1991 | Brochot et al. | .............. | 428/428 |
| 5,093,153 A | * | 3/1992 | Brochot et al. | ................ | 427/41 |
| 5,154,957 A | * | 10/1992 | Yamada et al. | ................ | 428/64 |
| 5,274,912 A | * | 1/1994 | Olenick et al. | ................ | 29/830 |
| 5,278,077 A | * | 1/1994 | Nakato | ........................ | 437/27 |
| 5,424,581 A | * | 6/1995 | Bourg, Jr et al. | ............ | 257/786 |
| 5,643,433 A | * | 7/1997 | Fukase et al. | ................. | 205/78 |
| 5,677,230 A | * | 10/1997 | Weitzel et al. | ................. | 437/67 |
| 5,700,735 A | * | 12/1997 | Shiue et al. | ................. | 438/612 |
| 5,703,408 A | * | 12/1997 | Ming-Tsung et al. | ........ | 275/784 |
| 5,718,039 A | * | 2/1998 | Saida et al. | .................... | 29/846 |
| 5,757,072 A | * | 5/1998 | Gorowitz et al. | ........... | 257/700 |
| 5,777,379 A | * | 7/1998 | Karavakis et al. | ........... | 257/668 |
| 5,792,538 A | * | 8/1998 | Yurescko-Suhan | ......... | 428/64.1 |
| 5,812,316 A | * | 9/1998 | Ochi et al. | ................... | 359/530 |
| 5,844,523 A | * | 12/1998 | Brennan et al. | ...... | 343/700 MS |
| 5,854,142 A | * | 12/1998 | Inoguchi et al. | ............. | 442/233 |
| 5,974,025 A | * | 10/1999 | Yamada et al. | .............. | 369/288 |

\* cited by examiner

*Primary Examiner*—A. Dexter Tugbang
(74) *Attorney, Agent, or Firm*—Jacqueline J. Garner; Wade James Brady III; Frederick J. Telecky, Jr.

(57) ABSTRACT

A reinforcing system for a bond which includes at least one dielectric layer or stack disposed under the bond pad. A reinforcing patterned structure is disposed in the dielectric layer or stack with the delectric filling the portion of the patterned structure from which the structure was removed after patterning.

18 Claims, 3 Drawing Sheets

SYSTEM AND METHOD FOR REINFORCING A BOND PAD

This application is a divisional application of Ser. No. 08/847,239 filed Apr. 30, 1997, now U.S. Pat. No. 6,143, 396.

TECHNICAL FIELD OF THE INVENTION

This invention is related in general to the field of semiconductor devices and processes. More particularly, the invention is related to a system and method for reinforcing a bond pad.

BACKGROUND OF THE INVENTION

A well known problem area in semiconductor processing is the process of attaching a solder, wire or other bonding elements to a bond pad on a semiconductor integrated circuit. These bond pads are typically disposed above one or more layers or stacks of brittle and/or soft dielectric materials, typically oxides of silicon and some organic materials, for planarization and insulation purposes. Some dielectric materials, such as hydrogen silsesquioxane (HSQ), aerogels, organic polyimides, and parylenes are advantageous for their low dielectric constants compared to silicon oxides, but are weaker structurally and mechanically.

During the bonding process, mechanical loading and ultrasonic stresses applied by the bonding capillary tip to the bond pad often result in fracture of the underlying dielectrics, deformation of the underlying metal structures, and delamination of the layers in the metal structures. These bonding failures may appear as craters in the bond pad and underlying layers as the bonding capillary tip is pulled away from the bonding pad. However, these defects often are not apparent during bonding but would manifest themselves during subsequent bond pull and shear tests, reliability tests such as thermal cyde or thermal shock, or upon deprocessing and cross-sectioning.

Further, weakness of the bond pad structure may also reveal itself during wafer probing prior to bonding. Again, the stresses exerted by the probe tips, typically formed of a hard metal such as tungsten, can cause localized fractures in the pads, despite the fact that then make contact with a soft metal, aluminum, on the bond pads. Such fractures are as much of a reliability hazard as those caused during bonding.

Traditionally, the bonding failures have been addressed by altering bonding parameters, such as ultrasonic power and pulse waveform, bonding temperature, bonding time, clamping force, shape of the bonding capillary tip, etc. Much time is spent experimenting with parameter settings and combinations thereof. Although general guidelines of parameter setpoints and configurations have been developed, the bonding failures persist at a sufficiently significant level to continually threaten the reliability of integrated circuit devices. Yet the failure levels are sufficiently low such that bonding failures become apparent only after several tens of thousands of devices are bonded.

Recent technological advances in semiconductor processing do not alleviate the situation. New dielectric materials with lower dielectric constants are being used to increase circuit speeds but they are mechanically weaker than the conventional plasma enhanced chemical vapor deposition (CVD) dielectrics. Decreasing bond pad dimensions necessitates the increase of vertical bonding force or forces attributable to the use of ultrasonic energy to form effective bonds. Inaccessibility of higher bond parameter settings for fear of damage to the bond pads also results in longer bond formation time, and consequently, lost throughput. All of these significant changes point to a trend of more severe failures and increase in their frequency.

SUMMARY OF THE INVENTION

Accordingly, there is a need for a reliable way to prevent or minimize the occurrence of probe and bonding failures where bond pads are situated above one or more structurally and mechanically weak dielectric layers.

In accordance with the present invention, a bond pad reinforcing system and method are provided which eliminate or substantially reduce the disadvantages associated with prior apparatus and methods.

In one aspect of the invention, the reinforcing system for a bond pad according to the teachings of the present invention includes a reinforcing patterned structure disposed in at least one dielectric stack disposed under the bond pad.

In another aspect of the invention, the reinforcing system for a bond pad according to the teachings of the present invention includes at least one dielectric layer or a stack of multiple dielectric layers disposed under the bond pad. A reinforcing patterned structure is disposed in at least one dielectric stack.

In yet another aspect of the invention, a method for reinforcing a bond pad in a semiconductor integrated circuit includes the steps of forming a metal layer, patterning the metal layer in a predetermined area into a predetermined pattern having a plurality of vacant areas, and forming a dielectric layer above the patterned metal layer, filling the vacant areas in the patterned metal layer. A bond pad is then formed on the dielectric layer above the patterned metal layer.

In one aspect of the invention, the reinforcing patterned structure may be a joined or interconnected structure. In another aspect of the invention, the reinforcing patterned structure may comprise disjoined or non-interconnected and repeating elements.

A technical advantage of the present invention is the improved structural integrity of bond pads so that forces exerted during bonding and probing do not damage the bond pad and underlying structures. These technical advantages are possible without changing bonding or probing parameters, which may decrease process throughput. The result is a more reliable integrated circuit and decreasing bonding failures.

BRIEF DESCRIPTION OF THE DRAWINGS

For a better understanding of the present invention, reference may be made to the accompanying drawings, in which.

DETAILED DESCRIPTION OF THE INVENTION

Figure 1:
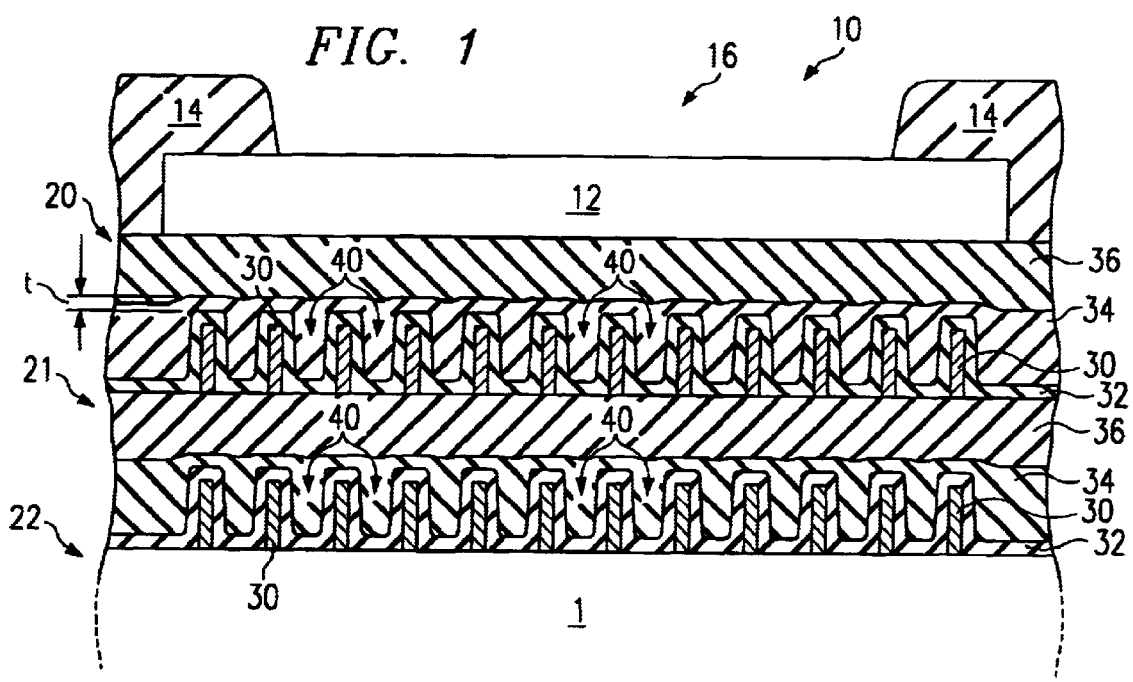
FIG. 1 is a cross-sectional view of an embodiment of a bond pad reinforcing structure according to the teachings of the present invention.

The preferred embodiments of the present invention are illustrated in FIGS. 1–11, like reference numerals being used to refer to like and corresponding parts of the various drawings.

Figure 2:
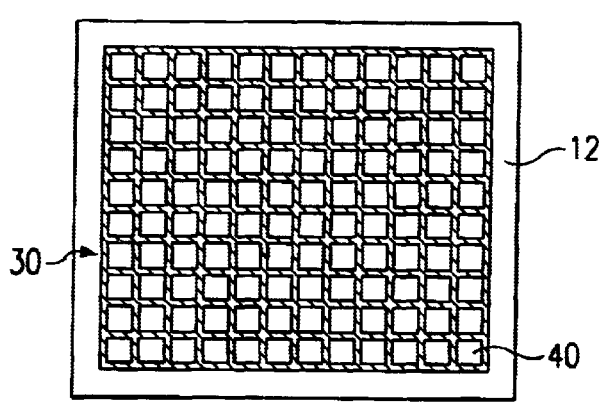
FIG. 2 is a plan view of the bond pad reinforcing structure in FIG. 1 according to the teachings of the present invention.

Referring to FIG. 1, a reinforcing structure 10 for a bond pad 12 according to the teachings of the present invention is shown. A center portion 16 of bond pad 12 is exposed and uncovered from a protective oxide layer 14 for receiving a ball bond (not shown), typically constructed from aluminum, gold, copper, solder, or like materials. Bond pad 12 is typically a multi-layered stack constructed of aluminum and one or more layers of titanium nitride and titanium, for example. Underlying bond pad 12 are one or more intermetal dieletric layers or one or more dielectric stacks 20–22, each constructed of multiple dielectric layers, the bottommost stack 22 disposed on a substrate 1. Each intermetal dielectric layer or stack 20–22 may include a reinforcing grid 30 disposed in at least one of the intermetal dielectric stacks 20–22. FIG. 2 shows a plan view of reinforcing grid 30, which has a regular repeating pattern with a plurality of voids or vacant areas 40.

At least one layer of the intermetal dielectric materials within each dielectric layer or stack 20–22 is constructed of a mechanically and structurally weak dielectric material, such as oxide, hydrogen silsesquioxane (HSQ), Aerogels, organic polyimides, parylenes, and the like. These dielectric materials are hereinafter referred to generally as weak dielectric materials. Each intermetal dielectric stack 20–22 may include, for example, a first dielectric layer 32, a weak dielectric layer 34, and a second dielectric layer 36. Dielectric layers 32 and 34 may be TEOS (tetraethyl orthosilicate) or any other oxide material formed by a suitable method. It may be seen that by providing a reinforcing structure 30 of a predetermined height, the thickness, t, of weak dielectric layer 34 atop reinforcing grid 30 is greatly reduced. Further, reinforcing grid 30 is a joined or interconnected grid structure with a plurality of voids or vacant areas 40 for containing and accommodating a large portion of weak dielectric material 34 therein. Accordingly, reinforcing structure 30 provides support and mechanical strength to intermetal dielectric stacks 20–22 to substantially decrease the incidence of cratering and other bonding failures caused by wire bonding.

It may be seen from FIGS. 1 and 2 that reinforcing structure 30 is generally planar with a thickness less than the desired thickness of intermetal dielectric stacks 20–22. Further, reinforcing structure 30 is preferably dimensioned to fit generally within and not significantly extending beyond an area defined by bond pad 12. When more than one reinforcing layer is used, reinforcing structure 30 for each intermetal dielectric stack 20–22 may be aligned directly above one another, as shown, or be offset with one another. It is contemplated by the teachings of the present invention that any number, including one, of reinforcing structures or layers may be used to achieve improved structural integrity and robustness. It is also contemplated by the teachings of the present invention that intermetal dielectric layers or stacks 20–22 may include reinforcing structures of different patterns, although such designs may require additional expense to use different masks to pattern etch the different metal reinforcing structures.

Bond pad reinforcing structure 10 may be constructed, by forming a layer of metal or any suitable conductor or semiconductor of predetermined thickness at the start of each intermetal dielectric layer or stack 20–22. The reinforcing layer is then pattern etched into the desired pattern, such as the grid pattern shown in FIGS. 1 and 2. Subsequent dielectric materials are then formed above the patterned reinforcing layer, such as a single dielectric layer or oxide layer 32, weak dielectric layer 34, and oxide layer 36 as shown. Note that weak dielectric layer 34 may be formed by a number of methods, including spin-on, plasma enhanced chemical vapor deposition (CVD), and vapor condensation.

Figure 4A:
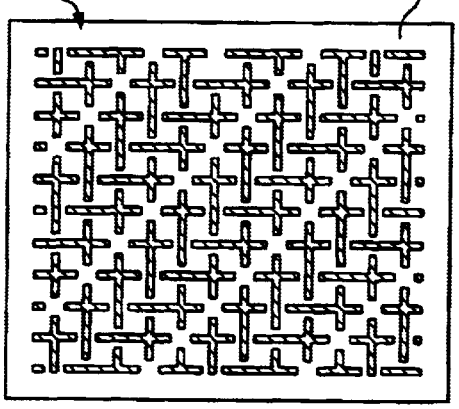
FIGS. 4A and 4B are plan views of the bond pad reinforcing structure in FIG. 3 according to the teachings of the present invention.
Figure 4B:
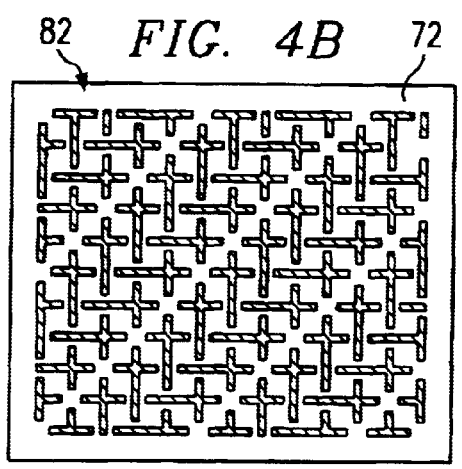
Figure 3:
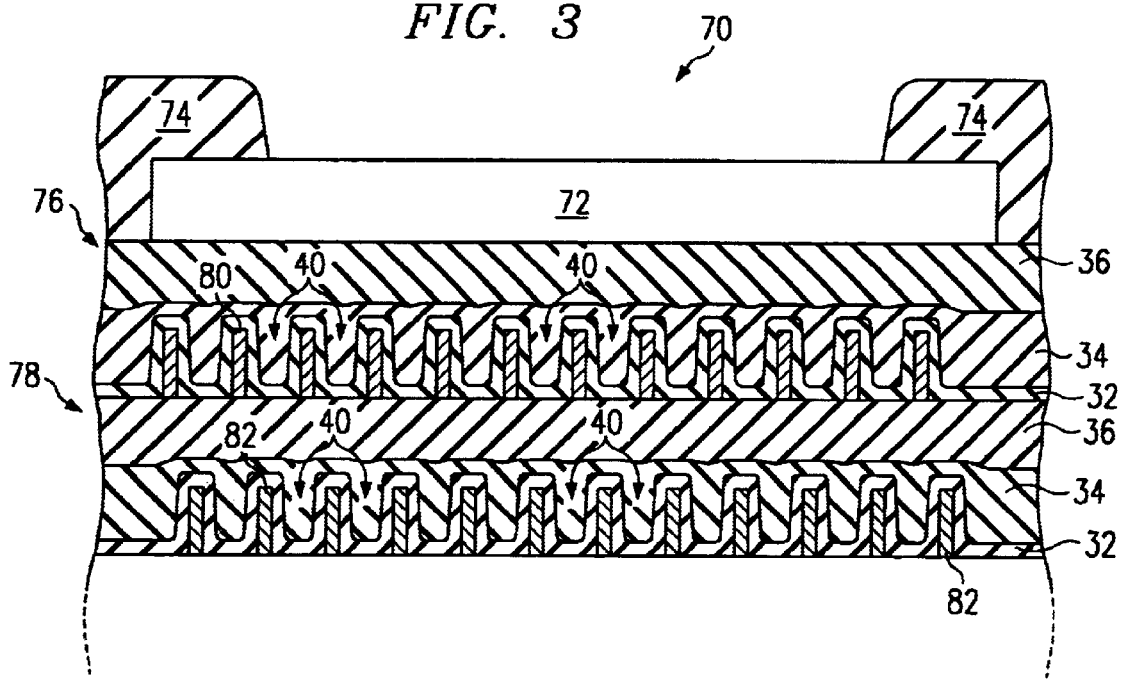
FIG. 3 is a cross-sectional view of another embodiment of a bond pad reinforcing structure according to the teachings of the present invention.

Referring to FIGS. 3, 4A, and 4B, another embodiment of bond pad reinforcing structure 70 is shown. A bond pad 72 is disposed below a protective overcoat of oxide 74 and partially exposed for wire/solder/flip-chip/wedge bonding. Two intermetal dielectric stacks 76 and 78 underlying bond pad 72 include reinforcing structures 80 and 82. Reinforcing structures 80 and 82 include a repeating and non-interconnected pattern such as the crucifix pattern shown arranged in a regular manner. It may be seen that reinforcing structure 80 and 82 may be slightly offset from one another as shown. The semiconductor integrated circuit may include one, two, or more than two intermetal dielectric layers or stacks with the crucifix reinforcing structure although only two are shown herein.

Figure 5:
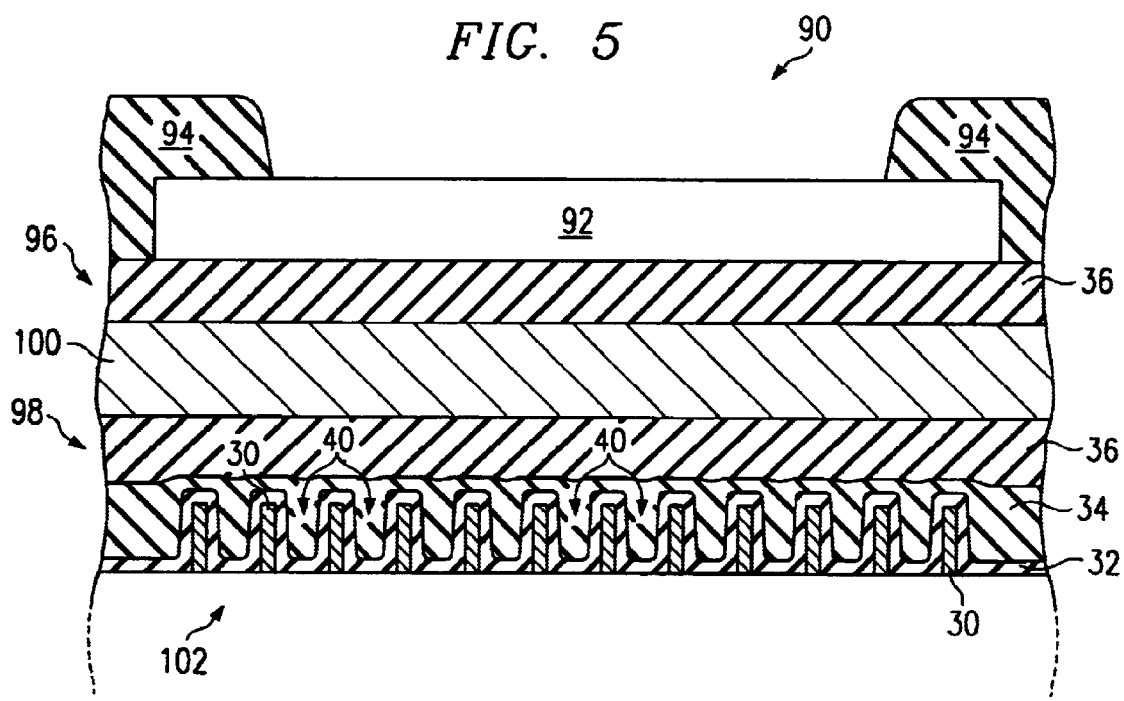
FIG. 5 is a cross-sectional view of yet another embodiment of a bond pad reinforcing structure according to the teachings of the present invention.
Figure 6:
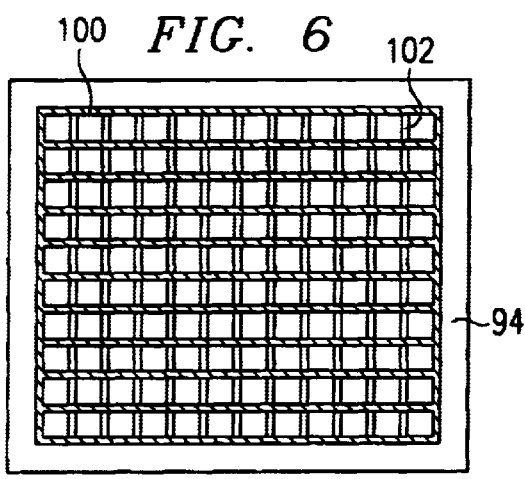
FIG. 6 is a plan view of the bond pad reinforcing structure in FIG. 5 according to the teachings of the present invention.

Yet another embodiment of the reinforcing structure according to the teachings of the present invention is shown in FIGS. 5 and 6 in cross-section and plan views, respectively. Intermetal dielectric stacks 96 and 98 underlie a bond pad 92, which is partially covered by a protective overcoat 94. Intermetal dielectric stacks 96 and 98 include reinforcing structures 100 and 102 respectively. Reinforcing structure 100 in intermetal dielectric stack 96 includes parallel reinforcing lines which are oriented preferably perpendicularly with parallel reinforcing lines of reinforcing structure 102 in intermetal dielectric stack 98. Accordingly, intermetal dielectric stacks in a semiconductor integrated circuit may have reinforcing lines oriented alternately with respect to one another to provide improved mechanical stability and strength. It is further contemplated by the teachings of the present invention to provide for reinforcing lines oriented in a manner other than 90° in alternating layers.

Figure 7:
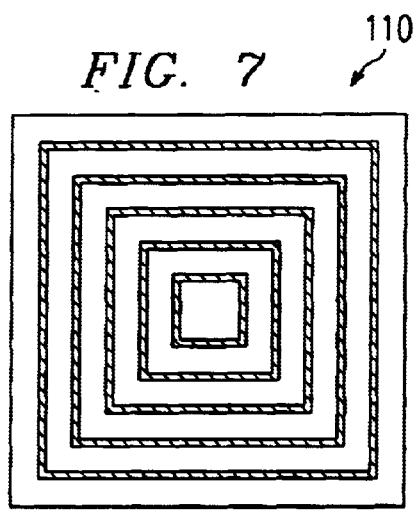
FIGS. 7–11 are further plan views of varying embodiments of the bond pad reinforcing structure according to the teachings of the present invention.

Referring to FIG. 7, an alternate embodiment 110 of the present invention according to the teachings of the present invention is shown. Reinforcing structure pattern 110 includes reinforcing lines forming a plurality of interconnected or unconnected nested rectangles or squares underlying the bond pad.

Figure 8:
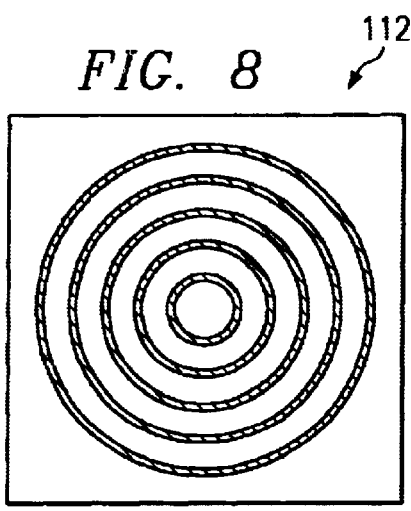
Figure 9:
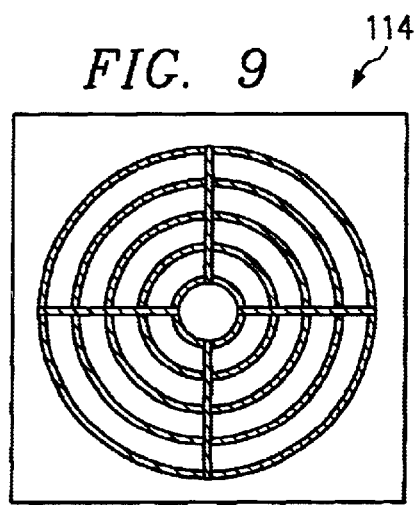
Figure 10:
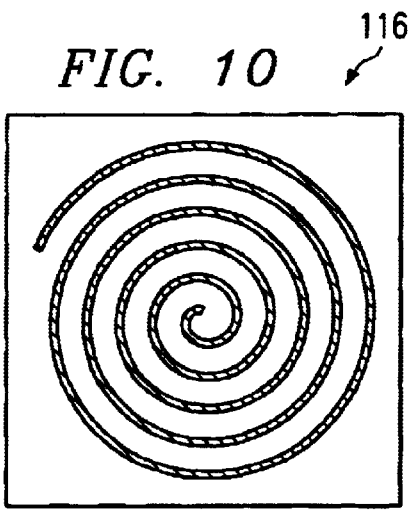

FIG. 8 shows yet another alternate embodiment 112 of possible reinforcing patterns according to the teachings of the present invention. Reinforcing structure 112 may include a plurality of nested unconnected circles or ellipses underlying the bond pad, as shown. A variation on the nested circle structure 112 is an interconnected or crosswise reinforced nested circle or ellipse reinforcing structure 114, as shown in FIG. 9. A further variation is a circular or elliptical spiral reinforcing structure 116 shown in FIG. 10. It may be seen that the teachings of the instant invention further contemplates any nested or spiral, either connected or unconnected, configuration used for the reinforcing structure pattern.

Figure 11:
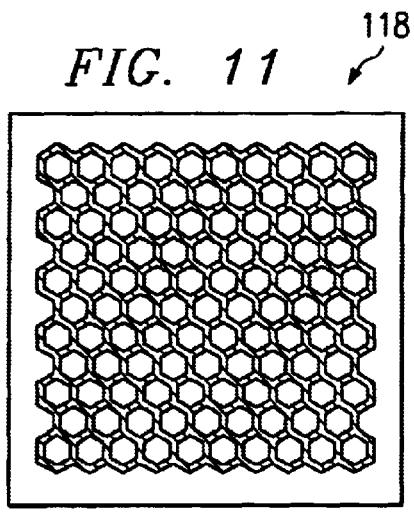

Referring to FIG. 11, a reinforcing structure 118 having a repeating connected honeycomb pattern is shown. Nature has shown that the honeycomb structure has superior structural integrity and strength and would therefore substantially fortify the weak dielectric layers.

It may be seen from above that the reinforcing structure may take on a variety of patterns. In general, the pattern may be regular and repeating, such as the grid, crucifix, honeycomb, and nested configurations. The pattern may also have connected or unconnected reinforcing elements. Non-repeating patterns may also be used. The reinforcing structure pattern preferably occupies the entire or a substantial area under the bond pad and allows the weak dielectric material to fill the vacant areas between the reinforcing lines of the reinforcing structure. Further, the composition of reinforcing structure may be the same as the metalization in the corresponding metal layers. For example, the reinforcing structure may have a titanium nitride/titanium nitride/titanium bottom layer, an aluminum middle layer, and a titanium nitride top layer. Reinforcing structure may also be constructed of other conductive or semiconductive materials.

It may be understood that the reinforcing structure of the instant invention is applicable to strengthen any bonds pad with underlying weak dielectric layers so that it may withstand stresses and forces imparted during any wire, solder, or other bonding processes, such as flip-chip bonding, ultrasonic bonding, thermosonic bonding, thermocompression bonding, solder bump or said bump bondings, and pre-bonding wafer probe operation.

Accordingly, the teachings of the present invention includes any structure constructed substantially within the bond pad that mechanically reinforces the underlying brittle and/or soft dielectric structures. It is particularly advantageous when the reinforcing structure is comprised of an existing layer that already goes through patterning, such as the interconnecting metal lines.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A method for reinforcing and improving the structural integrity of a bond pad in a semiconductor integrated circuit, comprising the steps of:

providing a substrate;

forming on said substrate a first dielectric reinforcing grid in a predetermined pattern with a plurality of depressions in said pattern;

forming a first dielectric layer having a thickness of a relatively weak dielectric material over said first dielectric reinforcing grid, said first dielectric layer filling the depressions in said pattern and extending over and covering said pattern, the thickness of said weak dielectric material a top said dielectric reinforcing grid being reduced relative to the thickness of said weak dielectric material in said depressions; and forming a bond pad on said first dielectric layer spaced from said first dielectric reinforcing grid, said grid being dimensioned to fit within an area defined by said bond gad.

2. The method, as set forth in claim 1, wherein the step of forming the first dielectric layer comprises the step of forming a dielectric layer taken from the group consisting of HSQ, aerogels, organic polyimides and parylenes.

3. The method of claim 2 wherein said first dielectric reinforcing grid entirely covers said substrate in the region of said substrate below said bond pad.

4. The method of claim 2 further including a dielectric which is relatively strong with respect to said weak dielectric disposed between said weak dielectric and said grid.

5. The method, as set forth in claim 1, wherein the patterning step comprises the step of patterning the first dielectric reinforcing grid with a repeating and interconnected pattern.

6. The method of claim 3 wherein said first dielectric reinforcing grid entirely covers said substrate in the region of said substrate below said bond pad.

7. The method of claim 5 further including a dielectric which is relatively strong with respect to said weak dielectric disposed between said weak dielectric and said grid.

8. The method, as set forth in claim 1, wherein the patterning step comprises the step of patterning the first dielectric reinforcing grid with a repeating and non-interconnected pattern.

9. The method of claim 8 wherein said first dielectric reinforcing grid entirely covers said substrate in the region of said substrate below said bond pad.

10. The method of claim 8 further including a dielectric which is relatively strong with respect to said weak dielectric disposed between said weak dielectric and said grid.

11. The method, as set forth in claim 1, wherein the patterning step comprises the step of patterning the first dielectric reinforcing grid with a nested configuration.

12. The method of claim 11 wherein said first dielectric reinforcing grid entirely covers said substrate in the region of said substrate below said bond pad.

13. The method of claim 11 further including a dielectric which is relatively strong with respect to said weak dielectric disposed between said weak dielectric and said grid.

14. The method, as set forth in claim 1, further comprising the step of repeating the first dielectric reinforcing grid forming, patterning, and dielectric layer forming steps at least one time prior to forming the bond pad thereon.

15. The method of claim 14 wherein said first dielectric reinforcing grid entirely covers said substrate in the region of said substrate below said bond pad.

16. The method of claim 14 further including a dielectric which is relatively strong with respect to said weak dielectric disposed between said weak dielectric and said grid.

17. The method of claim 1 wherein said first dielectric reinforcing grid entirely covers said substrate in the region of said substrate below said bond pad.

18. The method of claim 1 further including a dielectric which is relatively strong with respect to said weak dielectric disposed between said weak dielectric and said grid.

* * * * *